US010345406B2

(12) United States Patent
Splitthoff et al.

(10) Patent No.: US 10,345,406 B2
(45) Date of Patent: Jul. 9, 2019

(54) METHOD AND APPARATUS FOR MAGNETIC RESONANCE IMAGING

(71) Applicant: Siemens Healthcare GmbH, Erlangen (DE)

(72) Inventors: Stefanie Splitthoff, Erlangen (DE); Ralf Ladebeck, Erlangen (DE); Joerg Rothard, Litzendorf (DE); Johann Sukkau, Herzogenaurach (DE); Michael Wullenweber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 176 days.

(21) Appl. No.: 15/366,565

(22) Filed: Dec. 1, 2016

(65) Prior Publication Data
US 2017/0153308 A1    Jun. 1, 2017

(30) Foreign Application Priority Data

Dec. 1, 2015 (DE) .................. 10 2015 223 897

(51) Int. Cl.
*G01R 33/3875* (2006.01)
*G01R 33/565* (2006.01)

(52) U.S. Cl.
CPC ... *G01R 33/3875* (2013.01); *G01R 33/56563* (2013.01)

(58) Field of Classification Search
CPC ................ G01R 33/3875; G01R 33/56563
USPC ..................................................... 324/309
See application file for complete search history.

(56) References Cited

U.S. PATENT DOCUMENTS

| 2006/0164082 | A1* | 7/2006 | Foxall ............... G01R 33/3875 324/306 |
| 2008/0204018 | A1 | 8/2008 | Dewdney et al. |
| 2010/0052674 | A1 | 3/2010 | Jellus et al. |
| 2015/0241539 | A1 | 8/2015 | Kaneko et al. |
| 2015/0260811 | A1 | 9/2015 | Blumhagen et al. |
| 2016/0274202 | A1* | 9/2016 | Stemmer ............... A61B 5/055 |
| 2017/0131372 | A1* | 5/2017 | Dewdney ........... G01R 33/3875 |

* cited by examiner

Primary Examiner — Reena Aurora
(74) Attorney, Agent, or Firm — Schiff Hardin LLP

(57) ABSTRACT

Calculation of shim settings for magnetic resonance imaging includes defining an examination volume for the magnetic resonance imaging in a body of the examination object, determining a local shim volume, which includes a subregion of the examination volume, calculating shim settings, wherein a tissue, which is present in the local shim volume, of the body of the examination object is incorporated into the calculation of the shim settings, and acquiring magnetic resonance raw data of the examination volume by operation of a magnetic resonance scanner, using the calculated shim settings.

11 Claims, 2 Drawing Sheets

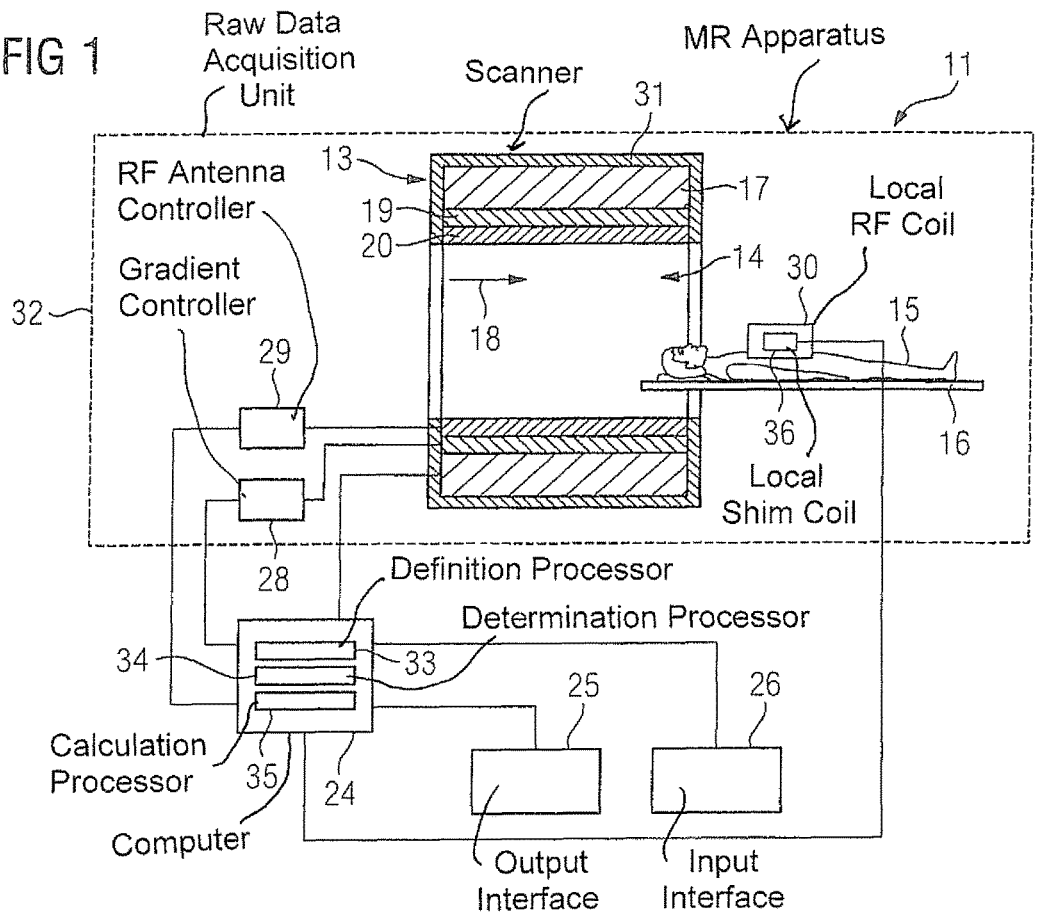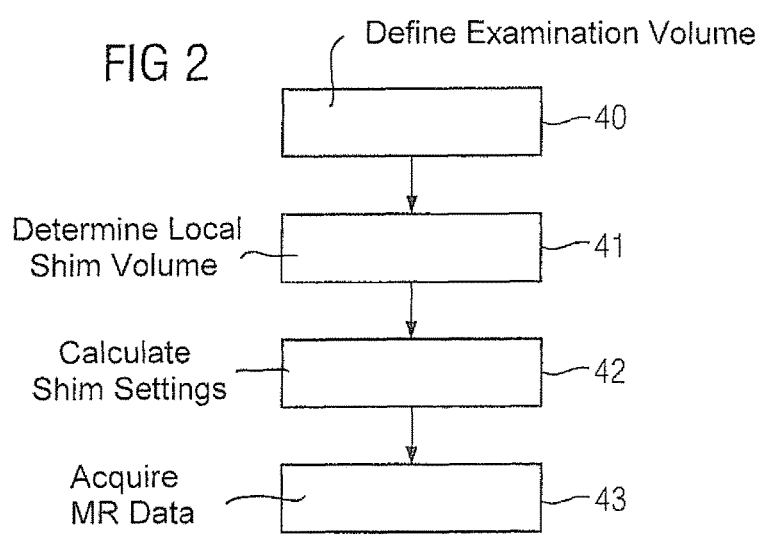

METHOD AND APPARATUS FOR MAGNETIC RESONANCE IMAGING

BACKGROUND OF THE INVENTION

Field of the Invention

The invention concerns a method for magnetic resonance imaging, and a magnetic resonance apparatus and a data storage medium for implementing such a method.

Description of the Prior Art

In a magnetic resonance apparatus, also referred to as magnetic resonance tomography system, the body to be examined of an examination person, in particular a patient, is usually exposed, with the use of a basic field magnet, to a relatively high basic magnetic field of 1.5 or 3 or 7 Tesla for instance. In addition, gradient pulses are activated with the use of a gradient coil arrangement. Radio-frequency pulses, for instance excitation pulses, are then emitted via a radio-frequency antenna using suitable antenna devices, with the result that nuclear spins of particular atoms that are resonantly excited by these radio-frequency pulses are tilted by a defined flip angle relative to the magnetic field lines of the basic magnetic field. As the nuclear spins relax, radio-frequency signals known as magnetic resonance signals are emitted, and are received and then further processed using suitable radio-frequency antennas. From the raw data acquired in this way, the desired image data can ultimately be reconstructed.

For a particular measurement, a particular magnetic resonance sequence, also called a pulse sequence, must be activated, which is composed of a sequence of radio-frequency pulses, for instance excitation pulses and refocusing pulses, as well as gradient pulses to be activated that are appropriately coordinated therewith, and proceed in various gradient axes along various spatial directions. Timed to coincide with this, readout windows are set that define the time periods in which the induced magnetic resonance signals are detected.

With the magnetic resonance imaging using a magnetic resonance scanner, the homogeneity of the basic magnetic field in an examination volume is of utmost importance. Excessive variances in the frequency distribution of the nuclear spins may occur even with small variances in the homogeneity, so that lower quality magnetic resonance image data are recorded.

Shim units are known in order to improve the homogeneity in the examination volume. After a magnetic resonance device is installed at its installation site, fields that are present in the surrounding area can restrict the homogeneity of the main magnetic field, in particular around an isocenter of the magnetic resonance scanner. Therefore during the installation and commissioning of a magnetic resonance apparatus, frequently in conjunction with measurements, the shim unit is set such that a homogeneity of the basic magnetic field that is as homogenous as possible is established. For this purpose, basic shim settings are calculated during the installation and commissioning of the magnetic resonance apparatus.

The examination object from which (whom) data are to be recorded represents a further inhomogeneity source. If a person to be examined is introduced into the magnetic resonance device for instance, the material of the person's body interferes with the homogeneity. In order to counteract this problem, it is known to use an adjustable shim unit. In particular, shim coils are known for this purpose that are controlled with different shim currents so as to generate different compensation magnetic fields in order to improve the homogeneity.

In order to shim these interferences of the object to be examined, it is conventional, firstly when the shim unit is controlled by the basic shim settings obtained during the installation and commissioning of the magnetic resonance device, to perform a measurement of the field distribution by operation of the magnetic resonance scanner itself, after the person to be examined has been introduced into the patient receiving zone of the magnetic resonance scanner. On the basis of the basic shim settings, updated shim settings are determined by a control computer by taking the measured field distribution into account. The shim unit is then controlled using the updated shim settings in order to achieve as optimal a homogeneity as possible.

SUMMARY OF THE INVENTION

An object of the invention is to enable an improved calculation of shim settings for magnetic resonance imaging.

The inventive method for magnetic resonance imaging of an examination object by operation of a magnetic resonance scanner has the following steps.

An examination volume for the magnetic resonance imaging in a body of the examination object is defined as an input to a processor. The processor determines a local shim volume, which includes a subregion of the examination volume.

The processor calculates shim settings, with a tissue of the body of the examination object that is present in the local shim volume being incorporated into the calculation of the shim settings. The processor operates the scanner to acquire raw magnetic resonance data of the examination volume using the calculated shim settings. The acquired raw data are made available from the processor in electronic form, as a data file.

The examination object may be a patient, a healthy test person, an animal or a phantom. The acquired raw magnetic resonance image data can be converted to image data and displayed to a user on a display monitor and/or stored in a database. The examination volume, also referred to as field of view (FOV), represents a volume that is mapped into the magnetic resonance image data. The examination volume is typically defined by a user, for instance from a localizer scan. Naturally the examination volume can alternatively or in addition also be defined automatically, for instance on the basis of a selected protocol.

The local shim volume represents a volume to be shimmed, for which the shim settings are to be calculated. Here the local shim volume can represent the subregion of the examination volume, which, with respect to inhomogeneities of the basic magnetic field, decisively influences the magnetic resonance imaging or an image quality of the acquired magnetic resonance image data. The fact that the local shim volume includes a subregion of the examination volume means that the local shim volume does not cover the examination volume completely. The local shim volume can be completely contained in the examination volume, in which case the local shim volume is smaller than the examination volume. In certain cases parts of the local shim volume can lie outside of the examination volume. In addition to the local shim volume, a global shim volume, which covers the entire examination region, may exist. Global shim settings that are separate from the local shim settings can then be calculated for the global shim volume.

The global shim settings are set separately for the global shim volume during acquisition of the magnetic resonance image data.

The calculation of the shim settings on the basis of the tissue of the body of the examination object that is present in the local shim volume may be a measurement of magnetic properties, for instance a field strength of the basic magnetic field (B0 field strength), of the tissue of the examination object that is present in the local shim volume. In this way, a B0 field map, which includes the local shim volume or is restricted hereto, can be measured. The shim settings can then be calculated on the basis of the field distribution stored in the B0 field map. Naturally other procedures that appear expedient to those skilled in the art are also conceivable for calculating the shim settings on the basis of the tissue present in the local shim volume.

The shim settings may be settings for controlling electrical shim coils of the magnetic resonance device. The fact that the magnetic resonance image data are acquired using the calculated shim settings means that, during the acquisition of the magnetic resonance image data, the shim coils are controlled on the basis of the shim settings. Different shim coils can be controlled on the basis of the calculated shim settings than on the basis of the global shim settings described above. In a preferred embodiment, the shim settings that are calculated on the basis of the tissue present in the local shim volume are designed to control local shim coils that are positioned especially close to the examination object. The shim settings can define a time-dependent current distribution of the currents in the shim coils. A shim control amplifier then applies the currents defined by the shim settings to the shim coils when the magnetic resonance image data is acquired. A frequency adjustment prior to acquiring the magnetic resonance image data can also be performed on the basis of the shim settings.

The calculated shim settings can be matched particularly suitably to the local shim volume. In this way the use of the shim settings during the acquisition of the magnetic resonance image data may result in a particularly high homogeneity of the basic magnetic field in the local shim volume or in a particularly advantageous balancing of inhomogeneities of the basic magnetic field in the local shim volume.

In an embodiment, during the acquisition of the magnetic resonance raw data, a local shim coil is controlled on the basis of the shim settings.

A local shim coil is arranged in an immediate spatial surrounding area of a surface, preferably a body surface of the examination object. For this purpose, the local shim coil can be integrated into a local radio-frequency coil, which is positioned on a body region to be examined of the examination object in order to acquire the magnetic resonance raw data. The local shim coil typically has one or more conductor loops, to which, during the acquisition of the magnetic resonance image data, a direct current defined on the basis of the shim settings is applied. In this way the local shim coils can contribute a limited B0 field contribution to the homogenization of the basic magnetic field.

The geometry of the conductor loops or of the current flowing through the conductor loops is selected such that the magnetic field interferences generated by the examination object can be balanced as effectively as possible on a local basis. The local shim coil thus can be designed to balance local inhomogeneities in the basic magnetic field, in particular in a limited body region of the examination object. Since the local shim coil is positioned close to the site of the magnetic field interferences, magnetic field interferences can be compensated by the local shim coil. Such interferences typically cannot be compensated with conventional global shim coils that are integrated into the scanner of the magnetic resonance apparatus.

The use of local shim coils may, however, also result in addition to the desired field curve, in undesirable magnetic field gradients, particularly in a direction at right angles to the local shim coil. These undesirable magnetic field gradients may result, depending on the distance of the volume to be shimmed from the local shim coil, in different shim currents or shim settings having to be set for in order to achieve a desirable compensation of the basic magnetic field. It would not be unusual for the local shim coil to be unable to achieve a homogenization of the magnetic field over the whole body of the examination object.

The local shim volume may be positioned in spatial proximity to the local shim coil and/or the local radio-frequency coil, into which the local shim coil is integrated. In this way the local shim volume can be matched particularly advantageously to the local shim coil, for instance to a position of the local shim coil and/or a current limitation of the local shim coil. The local shim volume may be, for instance, the limited body region of the examination object in which the basic magnetic field is to be homogenized by the local shim coil. Due to the advantageous positioning of the local shim volume, the shim settings can then also be designed to control the local shim coil during the acquisition of the magnetic resonance raw data.

In an embodiment, exclusively the tissue, which is present in the local shim volume, of the body of the examination object is incorporated into the calculation of the shim settings, on the basis of which the local shim coil is controlled.

Naturally in addition to the shim settings, global shim settings can be calculated for an actuation of global shim coils, which are integrated into a magnet unit of the magnetic resonance device. In this way tissue of the body of the examination object from a global shim volume which is larger than the local shim volume can also be incorporated into the calculation of the global shim settings. For the calculation of the shim settings to control the local shim coil, it is however advantageous to exclusively take the tissue from the local shim volume into account, since the local shim volume can be matched particularly advantageously to the local shim coil. In this way, the local shim volume can be determined separately from the global shim volume, so that the local shim volume can be selected particularly suitably to determine the shim settings.

In an embodiment, the local shim volume is determined on the basis of a positioning of the local shim coils with respect to the body of the examination object.

In this way a position and/or an alignment and/or a size of the local shim volume can be determined on the basis of the positioning of the local shim coil with respect to the body of the examination object. The determination takes place semi-automatically or automatically. In particular, a distance of the local shim volume from the local shim coil, for instance a spacing of an edge and/or a center of the shim volume from the positioning of the local shim coil, can be suitably selected.

Information describing how significantly the shim field of the local shim coil declines with an increasing distance from the local shim can be incorporated into the determination of the local shim volume on the basis of the positioning of the local shim coil. Below follows a more precisely described current limitation of the local shim coil, which can also be taken into account in the determination of the distance of the local shim volume from the local shim coil. If, for example, the local shim volume is positioned with an excessively large spacing from the local shim coil, the B0 field in the local shim volume may possibly no longer be suitably homogenized by the local shim coil. Such a positioning of the local shim volume may instead result in an unwanted excessive influence of the shim field of the local shim coil in an immediate surrounding area of the local shim coil, in particular outside of the local shim volume.

In order to match the local shim volume to the positioning of the local shim coil, position information that characterizes the positioning of the local shim coil with respect to the body of the examination object can be acquired. Using a priori knowledge, particularly known, a fixed positioning of the local shim coil, the position information can be stored in a database or a coil file. With variable positioning of the local shim coil, the position information can be acquired by methods known to those skilled in the art, for instance based on pre-measurement data acquired in a pre-measurement by operation of the magnetic resonance scanner.

In another embodiment, the local shim volume is determined on the basis of a current limitation of the local shim coil.

The current limitation of the local shim coil is determined by the design of the conductor of the local shim coil and/or by limits of the power supply (amplifier) to which the local shim coil is connected. One position and/or alignment and/or a size of the local shim volume can be selected such that, during the homogenization of the B0 field, the current limitation of the local shim coil is retained within the local shim volume. Therefore a spacing of the local shim volume from the local shim coil can be selected such that a current that is applied by the power supply of the local shim coil for shimming purposes in the local shim volume is within the operating or hardware limits of the power supply. In this way the local shim volume can be matched particularly well to parameters of the local shim coil.

In another embodiment, an anatomical structure of the body of the examination object is present in the examination volume and, prior to acquiring the magnetic resonance measurement data, a pre-measurement takes place using the magnetic resonance scanner, and the position of the anatomical structure is identified on the basis of the magnetic resonance pre-measurement data acquired in the pre-measurement. The determination of the local shim volume takes place using the identified position of the anatomical structure.

The local shim volume can serve, as described above, as a basis for the calculation of the shim settings to control a local shim coil. The matching to the anatomical structure in the body of the examination object is particularly expedient when such a local shim coil is used, particularly if the local shim coil is positioned in spatial proximity to the anatomical structure. Naturally it is also conceivable for the thus-determined local shim volume to serve as a basis for calculating shim settings in order to control global shim coils.

The anatomical structure is a structure in the body of the examination object that is of particular interest in the magnetic resonance image data. This means that the basic magnetic field in the region of the anatomical structure should be homogenized using the shim settings. This is facilitated particularly well by matching the local shim volume to the anatomical structure.

The pre-measurement for acquiring the magnetic resonance pre-measurement data can be concluded before starting the acquisition of the magnetic resonance raw data from which the diagnostic image data will be reconstructed. The magnetic resonance pre-measurement data can be acquired in a dedicated manner in order to determine the local shim volume. Alternatively or in addition, medical magnetic resonance pre-measurement data provided by the user for consideration can be acquired. Alternatively or in addition, measurement data acquired during an auto-align measurement, or a prescan normalize measurement, or a coil sensitivity measurement, can be used as the magnetic resonance pre-measurement data. Magnetic resonance pre-measurement data acquired in the auto-align measurement are particularly well-suited for use in determining the position of the anatomical structure, since coordinates of the anatomical structure, for instance the vertebral column, can be automatically acquired in the auto-align measurement. As described below, the magnetic resonance pre-measurement data acquired in the pre-measurement are preferably used directly to determine the shim settings.

The identification of the position of the anatomical structure may be an identification of a positioning and/or an alignment and/or a size of the anatomical structure in the magnetic resonance pre-measurement data. The local shim volume, in particular a position and/or an alignment and/or a size of the local shim volume, can then be determined on the basis of the identified positioning and/or alignment and/or size of the anatomical structure. Here the local shim volume can be determined so as to include the entire anatomical structure and/or a large part of the anatomical structure. The local shim volume can also be determined such that it is restricted to the size of the anatomical structure.

In an embodiment, the shim settings are calculated using the magnetic resonance pre-measurement data.

For this purpose the magnetic resonance pre-measurement data can be a three-dimensional measurement data record. A B0 field map that characterizes a distribution of the basic magnetic field in a measurement region of the pre-measurement is then determined on the basis of the magnetic resonance pre-measurement data, such as by a method known to those skilled in the art. The B0 field map can then serve as a basis to calculate the shim settings, in particular in the region of the local shim volume. A double-echo steady state (DESS) magnetic resonance sequence can be used particularly advantageously to acquire the magnetic resonance pre-measurement data.

The described procedure can be used to ensure that the magnetic resonance pre-measurement data are able to fulfill an advantageous double function. The magnetic resonance pre-measurement data can be established in order to determine the position of the anatomical structure, which serves as a basis for determining the local shim volume. At the same time, the magnetic resonance pre-measurement data can be incorporated directly into the calculation of the shim settings, by a B0 field map being generated from the magnetic resonance pre-measurement data, for instance. An additional measurement for determining the position of the anatomical structure can be omitted, thereby saving on measurement time.

In another embodiment, the anatomical structure is a vertebral column of the examination object, wherein projection data are produced from the magnetic resonance pre-measurement data, and the position of the vertebral column is identified on the basis of the projection data.

The projection data can be produced from the magnetic resonance pre-measurement data such that the projection data have a smaller dimension than the magnetic resonance pre-measurement data. The projection data are two-dimensional, while the magnetic resonance pre-measurement data are three-dimensional. The projection data can be produced from the magnetic resonance pre-measurement data using a method known to those skilled in the art. A Radon transformation can be used particularly advantageously, as described in more detail below.

The position of the vertebral column can be determined easily or automatically in the magnetic resonance pre-measurement data by the use of the projection data. An automated procedure for determining a local shim volume that is suitably matched to the vertebral column is thus conceivable.

In another embodiment, the production of the projection data from the magnetic resonance pre-measurement data is accomplished by the use of a Radon transformation of the magnetic resonance pre-measurement data, by which the magnetic resonance pre-measurement data are transferred into a sinogram, and the position of the vertebral column is identified in the sinogram.

The consideration underlying this procedure is that the position of the vertebral column can be identified particularly easily in the sinogram. Local intensity maxima in the sinogram correspond to elongated straight sections. The elongated straight sections typically have their maximum length in the region of the vertebral column. In this way the position of the vertebral column can be identified particularly easily by determining the local maxima in the sinogram.

Before transferring the magnetic resonance pre-measurement data into the sinogram, it may be beneficial, by the use of a reformatting, in particular a multiplanar reformatting (MPF), to transfer the measurement layers of the magnetic resonance pre-measurement data into sagittally or coronally oriented images, which can then be Radon-transformed. It may also be beneficial to perform a filtering of the magnetic resonance pre-measurement data prior to the Radon transformation. The use of a Canny filter (Canny edge detector), which is known to those skilled in the art, has proven to be advantageous. Such a Canny filter can highlight or monochromatize certain image regions in the magnetic resonance pre-measurement data, in which the difference in brightness between adjacent pixels is particularly high. The filtering of the magnetic resonance pre-measurement data may permit a simple determination of the vertebral column in the sinogram that is generated from the filtered magnetic resonance pre-measurement data by the Radon transformation.

The described procedure thus permits an automatic determination of the position of the vertebral column in the magnetic resonance pre-measurement data. In this way the local shim volume can be determined on the position of the vertebral column, and the shim settings can be well-suited to the homogenization of the basic magnetic field in the region of the vertebral column.

The inventive magnetic resonance apparatus has a raw data acquisition scanner operated by a computer that has a definition processor, a determination processor and a calculation processor configured to implement the inventive method.

The inventive magnetic resonance apparatus is thus designed to execute the inventive method of magnetic resonance imaging of an examination object. The definition processor is configured to define an examination volume for the magnetic resonance imaging in a body of the examination object. The determination processor is designed to determine a local shim volume, which represents a subregion of the examination volume. The calculation processor is configured to calculate shim settings, wherein a tissue of the body of the examination object that is present in the local shim volume is incorporated into the calculation of the shim settings. The image data acquisition scanner is to acquire magnetic resonance raw data of the examination volume using the calculated shim settings.

The components of the computer of the inventive magnetic resonance apparatus, namely the definition processor, the determination processor and the calculation processor, can predominantly be embodied as software components. In principle, however, these components can also be software-supported hardware components, for example, FPGAs or the like, especially if particularly fast calculations are to be performed. Similarly if only a transfer of data from other software components is needed, the required interfaces can also be configured as software interfaces. However, they can also be configured as interfaces constructed with hardware, which are controlled by suitable software. It is naturally also conceivable for a number of the cited components to be combined in the form of an individual software component or software-supported hardware component.

A non-transitory, computer-readable data storage medium according to the invention is directly loadable into a memory of a programmable computer of a magnetic resonance apparatus and is encoded with program code in order to cause the method according to the invention to be implemented when the computer code is executed in the computer of the magnetic resonance apparatus. This allows the inventive method to be performed quickly and robustly, and to be identically repeated. The computer must have pre-conditions such as a suitable working memory, a suitable graphics card or a suitable logic unit so that the respective method steps can be carried out efficiently. Examples of electronically readable data storage media are a DVD, a magnetic tape or a USB stick, on which electronically readable control information, in particular software (see above) is stored.

The advantages of the inventive magnetic resonance apparatus and storage medium essentially correspond to the advantages of the inventive method, which are explained above in detail. Features, advantages or alternative embodiments mentioned above are also applicable to the other aspects of the invention. The functional features of the method are executed by suitable modules, such as hardware modules.

BRIEF DESCRIPTION OF THE DRAWINGS

FIG. 1 is a schematic illustration of the inventive magnetic resonance apparatus.

FIG. 2 is a flowchart of a first embodiment of the method according to the invention.

DESCRIPTION OF THE PREFERRED EMBODIMENTS

Figure 3:
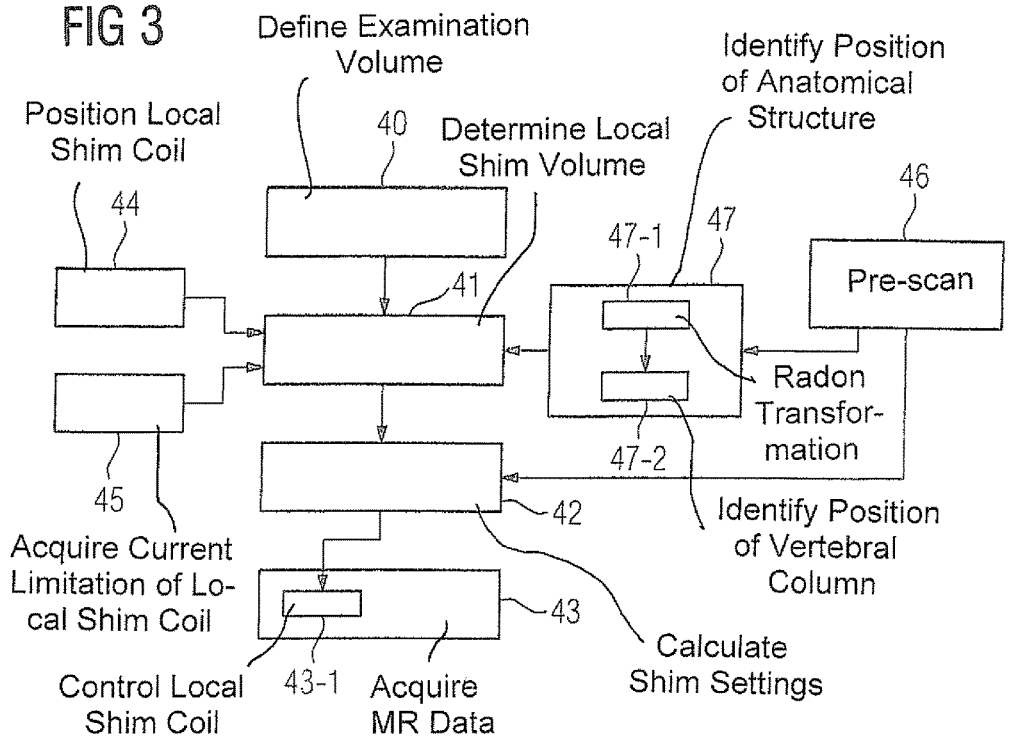
FIG. 3 is a flowchart of a second embodiment of the method according to the invention.

FIG. 1 schematically illustrates an inventive magnetic resonance apparatus 11. The magnetic resonance apparatus 11 has a scanner 13 with a basic field magnet 17 that generates a strong and constant basic magnetic field 18. The magnetic resonance scanner 13 additionally has a patient receiving zone 14 in the shape of a cylinder for receiving an examination object 15, in the present case a patient, the patient receiving zone 14 being cylindrically surrounded by the scanner 13 in a circumferential direction. The patient 15 can be moved by a patient support 16 into the patient receiving zone 14. The patient support 16 has a couch, which is disposed in a movable manner within the magnetic resonance scanner 13. The scanner 13 is screened toward the outside by a housing shell 31.

The scanner 13 also has a gradient coil arrangement 19 that generates magnetic field gradients for spatial encoding during imaging. The gradient coil arrangement 19 is controlled by a gradient controller 28. Furthermore, the scanner 13 has a radio-frequency antenna 20 that, in the case shown is configured as a body coil firmly integrated into the scanner 13, and a radio-frequency antenna controller 29. The radio-frequency antenna 20 is controlled by the radio-frequency antenna controller 29 to radiate a radio-frequency magnetic resonance sequence into an examination space that is substantially formed by the patient receiving zone 14. The emitted radio-frequency sequence excites certain nuclei in the patient 15, causing the magnetization thereof to be deflected from the field lines of the basic magnetic field 18. As those excited nuclear spins relax, they emit radio-frequency magnetic resonance signals. The radio-frequency antenna 20 is further designed to receive the magnetic resonance signals from the patient 15.

For controlling the basic field magnet 17, the gradient controller 28 and the radio-frequency antenna controller 29, the magnetic resonance apparatus 11 has a computer 24. The computer 24 controls the magnetic resonance apparatus 11 centrally, such as to perform a predetermined imaging gradient echo sequence. Control information such as imaging parameters and reconstructed magnetic resonance images can be provided to a user on an output interface 25, in the present case a display monitor, of the magnetic resonance apparatus 11. Furthermore, the magnetic resonance apparatus 11 has an input interface 26, via which information and/or parameters can be entered by a user during a measurement procedure. The computer 24 can include the gradient controller 28 and/or the radio-frequency antenna controller 29 and/or the output interface 25 and/or the input interface 26.

In the case shown, the computer 24 has a definition processor 33, a determination processor 34 and a calculation processor 35.

The magnetic resonance apparatus 11 further comprises a raw data acquisition unit 32. In the present case the raw data acquisition unit 32 is formed by the scanner 13 together with the radio-frequency antenna controller 29 and the gradient controller 28. The magnetic resonance apparatus 11 is thus designed, together with the raw data acquisition unit 32 and the computer 24, to carry out the inventive method of magnetic resonance imaging.

In the case shown in FIG. 1, the magnetic resonance apparatus 11 has a local radio-frequency coil 30, which is designed to receive magnetic resonance signals. The local radio-frequency coil 30 is likewise included in the image data acquisition unit 32. The local radio-frequency coil 30 is applied to a body region to be examined of the examination object 15 for a magnetic resonance examination by a medical operating personnel. The local radio-frequency coil 30 can be a knee antenna, back antenna, head antenna, etc. It is also conceivable for more than one local radio-frequency coil 30 to be positioned on the examination object 15.

The local radio-frequency coil 30 has a local shim coil 36, which, in the case shown, is integrated into a housing of the local radio-frequency coil 30. Naturally another positioning of the local shim coil 36 is also conceivable. While the magnetic resonance raw data are acquired by the raw data acquisition unit 32, the local shim coil 36 can be controlled on the basis of shim settings calculated by the calculation processor 35.

The magnetic resonance apparatus 11 can naturally have further components, which magnetic resonance apparatuses usually have. The general mode of operation of a magnetic resonance apparatus is known to those skilled in the art so that a detailed description of the further components is not necessary herein.

FIG. 2 is a flowchart of a first embodiment of the inventive method of magnetic resonance imaging of the examination object 15 by operation of the magnetic resonance apparatus 11.

In a first method step 40, an examination volume is defined by means of the definition processor 33 of the computer 24 for the magnetic resonance imaging in a body of the examination object.

In a further method step 41, a local shim volume is determined by the determination processor 34 of the computer 24, wherein the local shim volume has a subregion of the examination volume.

In a further method step 42, shim settings are calculated by the calculation processor 35 of the computer 24, wherein a tissue of the body of the examination object which is present in the local shim volume is incorporated into the calculation of the shim settings.

In a further method step 43, magnetic resonance image data of the examination volume is acquired by the scanner 13 of the magnetic resonance apparatus 11, wherein the magnetic resonance raw data are acquired using the calculated shim settings.

FIG. 3 is a flowchart of a second embodiment of the inventive method of magnetic resonance imaging of the examination object 15 by operation of the magnetic resonance apparatus 11.

The following description is essentially restricted to the differences from the exemplary embodiment in FIG. 2 wherein, with regard to method steps which remain the same, reference is made to the description of the exemplary embodiment in FIG. 2. Method steps which are substantially the same are always identified with the same reference signs.

The embodiment of the method according to the invention shown in FIG. 3 essentially includes the method steps 40, 41, 42, 43, of the first embodiment of the method according to the invention as shown in FIG. 2. In addition, the embodiment of the method according to the invention shown in FIG. 3 additionally includes method steps and substeps. Also conceivable is an alternative method sequence to that of FIG. 3 which has only part of the additional method steps and/or substeps represented in FIG. 3. Naturally, an alternative method sequence to that of FIG. 3 can also have additional method steps and/or substeps.

FIG. 3 shows two possible procedures, below called a first variant and a second variant, for determining the local shim volume, which can be used separately from one another or combined. The first variant includes the further method steps 44 and 45, which are introduced in FIG. 3 compared with FIG. 2. The second variant includes the further method steps 46 and 47 which are introduced in FIG. 3 compared with FIG. 2.

In the first variant of determining the local shim volume, while the magnetic resonance image data is acquired, in a further method step 43-1, a local shim coil 36 is controlled on the basis of the shim settings. This is also possible, but not imperative, in the second variant described in one of the following sections. It may be meaningful that the tissue of the body of the examination object 15 which is present in the local shim volume is incorporated exclusively in the calculation of the shim settings on the basis of which the local shim coil is controlled.

To calculate the shim settings for the local shim coil 36, in the further method step 44 a positioning of the local shim coil 36 with respect to the body of the examination object 15 can then be acquired and then in the further method step 41, the local shim volume is determined on the basis of the positioning of the local shim coil 36. It is alternatively or in addition conceivable in the further method step 45 for a current limitation of the local shim coil to be acquired, on the basis of which the local shim volume can then be determined in the further method step.

In the second variant of determining the local shim volume, before acquiring the magnetic resonance measurement data in the further method step 46, a pre-measurement takes place by operation of the magnetic resonance device 11, wherein magnetic resonance pre-measurement data are acquired. In the further method step 47, the position of an anatomical structure of the body of the examination object 15 can then be identified on the basis of the magnetic resonance pre-measurement data. Then in the further method step 41, the local shim volume can be determined by using the identified position of the anatomical structure. The shim settings can also be calculated in the further method step 42 by using the magnetic resonance pre-measurement data.

When the anatomical structure is a vertebral column of the examination object 15, the position of the vertebral column is identified by, in the further method step 47, producing projection data from the magnetic resonance pre-measurement data and the position of the vertebral column is identified on the basis of the projection data. For this purpose in a first sub step 47-1 of the further method step 47 a radon transformation of the magnetic resonance pre-measurement data can be performed, by which the magnetic resonance pre-measurement data are transferred into a sinogram. In a second substep 47-2 of the further method step 47, the position of the vertebral column can then be identified in the sinogram.

Figure 4:
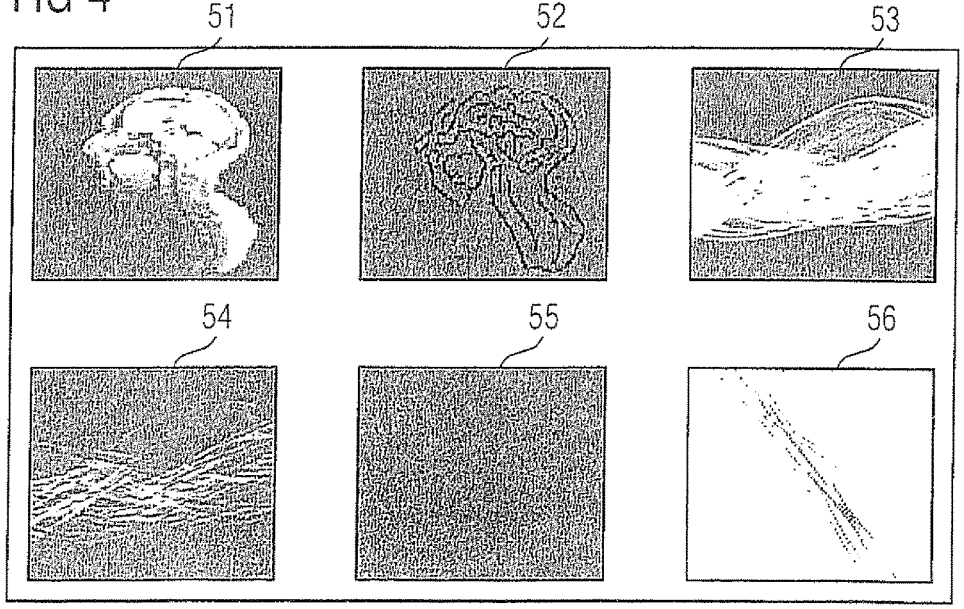
FIG. 4 shows an example of identifying the position of the vertebral column in the magnetic resonance pre-measurement data.

In FIG. 4, this variant of identifying the position of the vertebral column in the magnetic resonance pre-measurement data (see method step 47 in FIG. 3) is shown step-by-step. Naturally FIG. 4 only illustrates one exemplary possibility of how the position of the vertebral column can be automatically determined.

As a starting point magnetic resonance pre-measurement data is present in a sagittal alignment in step 51, which, in the case shown, maps the head and a part of the vertebral column of the examination object 15.

Then in step 52 a Canny filter (Canny edge detector) is applied to the magnetic resonance pre-measurement data, in order to highlight or monochromatize certain image regions in the magnetic resonance pre-measurement data, in which the difference in brightness between adjacent pixels is particularly high.

In step 53 the thus filtered image projection data is produced from the magnetic resonance pre-measurement data by means of a radon transformation. The projection data is now present as a sinogram, as shown in step 53. The position of the vertebral column can now be determined particularly easily in the following steps with the sinogram.

Local intensity maxima in the sinogram are now identified in step 54 and step 55. In the case shown in FIG. 4, the local intensity maxima is identified in two computer steps, naturally a varying number of computer steps is also conceivable. The local intensity maxima in the sinogram correspond in particular to longitudinal straight sections, which typically have their maximum length in the region of the vertebral column.

A back transformation of the sinogram takes place in step 56, in which the local intensity maxima have been extracted, by means of an inverse radon transformation. It is apparent that the position of the vertebral column is now particularly prominent in step 56. The described procedure thus permits an automatic determination of the position of the vertebral column in the magnetic resonance pre-measurement data. In this way the local shim volume can be particularly advantageously determined on the position of the vertebral column and the shim settings can be particularly suited to the homogenization of the main magnetic field in the region of the vertebral column.

The method steps of the method according to the invention shown in FIGS. 2-4 are carried out by the computer 24. For this purpose, the computer 24 has software and/or computer programs stored in a memory of the computer 24. The software and/or computer programs include program code that cause the method according to the invention to be implemented when the computer code is executed in the computer 24.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) raw data from an examination subject, comprising:
   providing a computer with an input that electronically defines an examination volume within an examination subject from which raw MR data are to be acquired, by operation of an MR data acquisition scanner in which a basic magnetic field is produced that has a basic field distribution that exhibits a basic field homogeneity;
   providing said computer with a further input that electronically defines a local shim volume, which is a sub-region of said examination volume;
   providing said computer with a further input that electronically designates an attribute of tissue that is present in said local shim volume;
   in said computer, executing an algorithm that uses said attribute of said tissue, to calculate shim settings to set a shim device in said scanner so as to modify the field distribution of the basic magnetic field and thereby improve the basic field homogeneity; and
   setting said shim device according to the calculated shim settings, and thereafter operating said MR data acquisition scanner to acquire said MR raw data from the examination volume with said basic magnetic field having the improved homogeneity.

2. A method as claimed in claim 1 wherein said shim device is a shim coil, and wherein said method comprises setting said shim device with the calculated shim settings by operating said shim coil with said shim settings.

3. A method as claimed in claim 2 comprising calculating said shim settings exclusively based on said attribute of said tissue.

4. A method as claimed in claim 2 comprising providing said computer with said input that electronically determines said local shim volume by providing said computer with a position of said shim coil with respect to said examination subject.

5. A method as claimed in claim 2 comprising providing said computer with said electronic designation of said local shim volume based on a current limitation of said local shim coil.

6. A method as claimed in claim 1 wherein said examination subject has an anatomical structure in said examination volume, and comprising providing said computer with said electronic designation of said attribute of said tissue comprises:
   operating said MR scanner to conduct a prescan prior to acquiring said MR raw data, and providing said computer with prescan data obtained in said prescan;
   in said computer, using said prescan data to identify a position of said anatomical structure in said examination volume; and
   in said computer, determining said local shim volume using the identified position of the anatomical structure in the examination volume.

7. A method as claimed in claim 6 comprising also using the prescan data to calculate said shim settings.

8. A method as claimed in claim 7 wherein said anatomical structure is a vertebral column of the examination subject, and acquiring projection data as said prescan data, and identifying the position of the vertebral column from said projection data.

9. A method as claimed in claim 8 comprising generating said projection data from said prescan data by, executing a Radon transformation of said prescan data in said computer and thereby transferring the prescan data into a sinogram, and identifying the position of the vertebral column in said sinogram.

10. A magnetic resonance (MR) apparatus comprising:
   an MR data acquisition scanner comprising a basic field magnet and a shim device;
   a computer provided with an input that electronically defines an examination volume within an examination subject from which raw MR data are to be acquired, by operation of said MR data acquisition scanner in which a basic magnetic field is produced by said basic field magnet that has a basic field distribution that exhibits a basic field homogeneity;
   said computer being provided with a further input that electronically defines a local shim volume, which is a sub-region of said examination volume;
   said computer being provided with a further input that electronically designates an attribute of tissue that is present in said local shim volume;
   said computer being configured to execute an algorithm that uses said attribute of said tissue, to calculate shim settings to set said shim device in said scanner so as to modify the field distribution of the basic magnetic field and thereby improve the basic field homogeneity; and
   said computer being configured to cause said shim device to be set according to the calculated shim settings, and thereafter to operate said MR data acquisition scanner to acquire said MR raw data from the examination subject with said basic magnetic field having the improved homogeneity.

11. A non-transitory, computer-readable data storage medium encoded with programming instructions, said storage medium being loaded into a computer of a magnetic resonance (MR) apparatus that comprises an MR data acquisition scanner, said programming instructions causing said computer to:
   receive an input that electronically defines an examination volume within an examination subject from which raw MR data are to be acquired, by operation of the MR data acquisition scanner in which a basic magnetic field is produced that has a basic field distribution that exhibits a basic field homogeneity;
   receive a further input that electronically defines a local shim volume, which is a sub-region of said examination volume;
   receive a further input that electronically designates an attribute of tissue that is present in said local shim volume;
   execute an algorithm that uses said attribute of said tissue, to calculate shim settings to set a shim device in said scanner to modify the field distribution of the basic magnetic field and thereby improve the basic field homogeneity; and
   cause said shim device to be set according to the calculated shim settings, and thereafter operate said MR data acquisition scanner to acquire MR raw data from the examination subject with said basic magnetic field having the improved homogeneity.

* * * * *